(12) United States Patent
Shen et al.

(10) Patent No.: US 7,133,788 B2
(45) Date of Patent: Nov. 7, 2006

(54) PROCESS CONTROLLER FOR SEMICONDUCTOR MANUFACTURING

(75) Inventors: You-Wei Shen, Hsinchu (TW); Young-Cheng Chen, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 10/899,612

(22) Filed: Jul. 27, 2004

(65) Prior Publication Data
US 2006/0025935 A1    Feb. 2, 2006

(51) Int. Cl.
*G06F 19/00* (2006.01)
(52) U.S. Cl. .............................. 702/84; 438/5; 700/121
(58) Field of Classification Search ................... 438/5; 702/30, 35, 40; 700/28, 95, 121; 716/19; 250/423, 424
See application file for complete search history.

(56) References Cited

U.S. PATENT DOCUMENTS 6,368,879 B1 *   4/2002   Toprac .......................... 438/5
6,745,086 B1 *   6/2004   Pasadyn et al. ................ 700/28
2005/0197721 A1 *   9/2005   Chen et al. .................... 700/45

\* cited by examiner

Primary Examiner—Patrick J. Assouad
(74) Attorney, Agent, or Firm—Haynes and Boone, LLP

(57) ABSTRACT

The present disclosure relates generally to the field of semiconductor manufacturing. In one example, in a production flow of low-volume, high-precision semiconductor products, a method for controlling critical dimensions of a semiconductor product during a semiconductor processing operation in the production flow, the semiconductor processing operation requiring a desired energy value to achieve the critical dimensions includes: measuring a previously formed critical dimension on the product; calculating a first energy value based on the measured critical dimension and a desired critical dimension for the semiconductor processing operation; and obtaining the desired energy value based on the calculated first energy value and a previously-obtained desired energy for the semiconductor processing operation performed on a prior product in the production flow.

20 Claims, 3 Drawing Sheets

PROCESS CONTROLLER FOR SEMICONDUCTOR MANUFACTURING

CROSS-REFERENCE

This application is related to U.S. patent application Ser. No. 10/979,515 filed on Nov. 2, 2004.

BACKGROUND

The present disclosure relates generally to the field of semiconductor manufacturing, and more particularly, to the field of integrated circuit metrology for controlling critical dimensions of features formed on semiconductor wafers.

With the advancement of semiconductor manufacturing, current semiconductor fabrication design rules allow ultra large scale integration (ULSI) devices to possess submicron features, increased transistor and circuit speeds, and improved reliability. To ensure that the devices are of a desired size, e.g., they do not improperly overlap or interact with one another, the design rules define such things as the tolerances between devices and interconnecting lines, and the widths of the lines. The design rule limitation will often define a desired range for line and spacing dimensions, such as the width of a line or the amount of space between two lines permitted in the fabrication of devices.

Frequently, dimensional errors indicate certain instability in a critical part of the semiconductor manufacturing processes. Dimensional errors may arise from any number of sources, such as optical (e.g., lens field curvature or lens aberration in a photolithography system), mechanical, or chemical (e.g., thickness non-uniformity of resist coating and anti-reflection coating (ARC)) sources. In one example, lithography machines, which facilitate pattern projection on wafers, may cause dimensional errors by supplying an incorrect energy amount (e.g., the radiation used for exposure). Accordingly, among other things, it is desirable to provide adequate control of the energy dose to ensure that the dimension complies with the predefined specification.

For those reasons and other reasons that will become apparent upon reading the following detailed description, there is a need for an improved dimension controller.

BRIEF DESCRIPTION OF THE DRAWINGS

Aspects of the present disclosure are best understood from the following detailed description when read with the accompanying figures.

DETAILED DESCRIPTION

Figure 1:
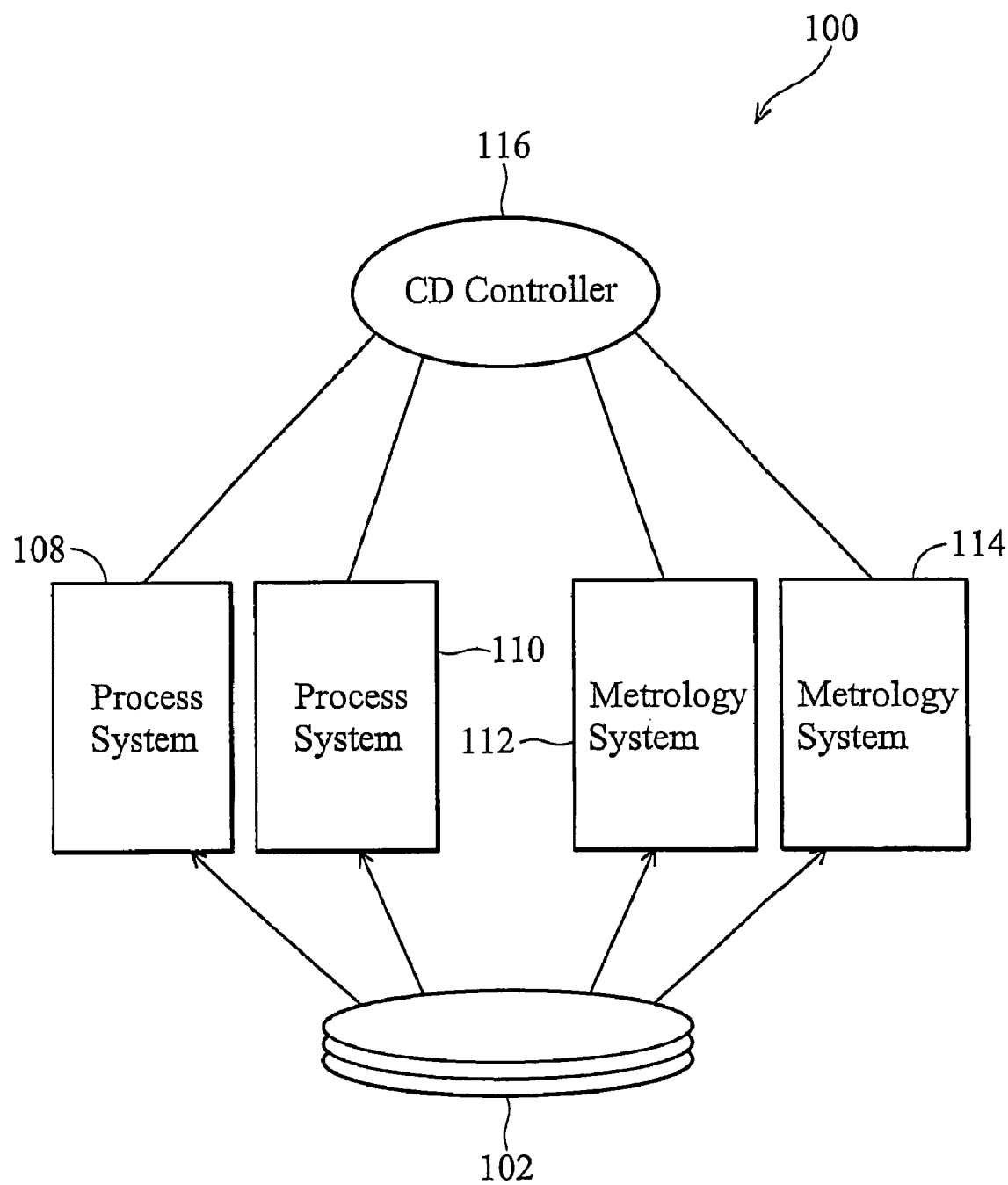
FIG. 1 illustrates a simplified lithography system 100 according to one embodiment of the present disclosure.

The present disclosure relates generally to the field of semiconductor manufacturing, and more particularly, to the field of integrated circuit metrology for controlling critical dimensions of features formed on semiconductor wafers.

For the purposes of promoting an understanding of the principles of the invention, references will now be made to the embodiments, or examples, illustrated in the drawings and specific languages will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring now to FIG. 1, shown therein is a simplified lithography system 100 according to one embodiment of the present disclosure. In this embodiment, the lithography system 100 may comprise one or more wafers 102, inline process systems 108 and 110, which may comprise a scanner or other lithography machines known in the art, metrology systems 112 and 114, which may be any suitable machine known in the art such as CD-scanning electron microscope (CD-SEM), and a CD controller 116. In this example, the CD controller 116 is a hardware/software system for controlling the critical dimension of the pattern by a feedback mechanism and algorithm through run-to-run process. The CD controller 116 may be designed for producing low-volume and high-quality semiconductor devices. However, it is also contemplated that the CD controller 116 may be used for other circumstances. The CD controller 116 may comprise software programs, such as C, C++, Java or other programs, to implement a process 200, which will be described in connections with FIG. 2.

Figure 2:
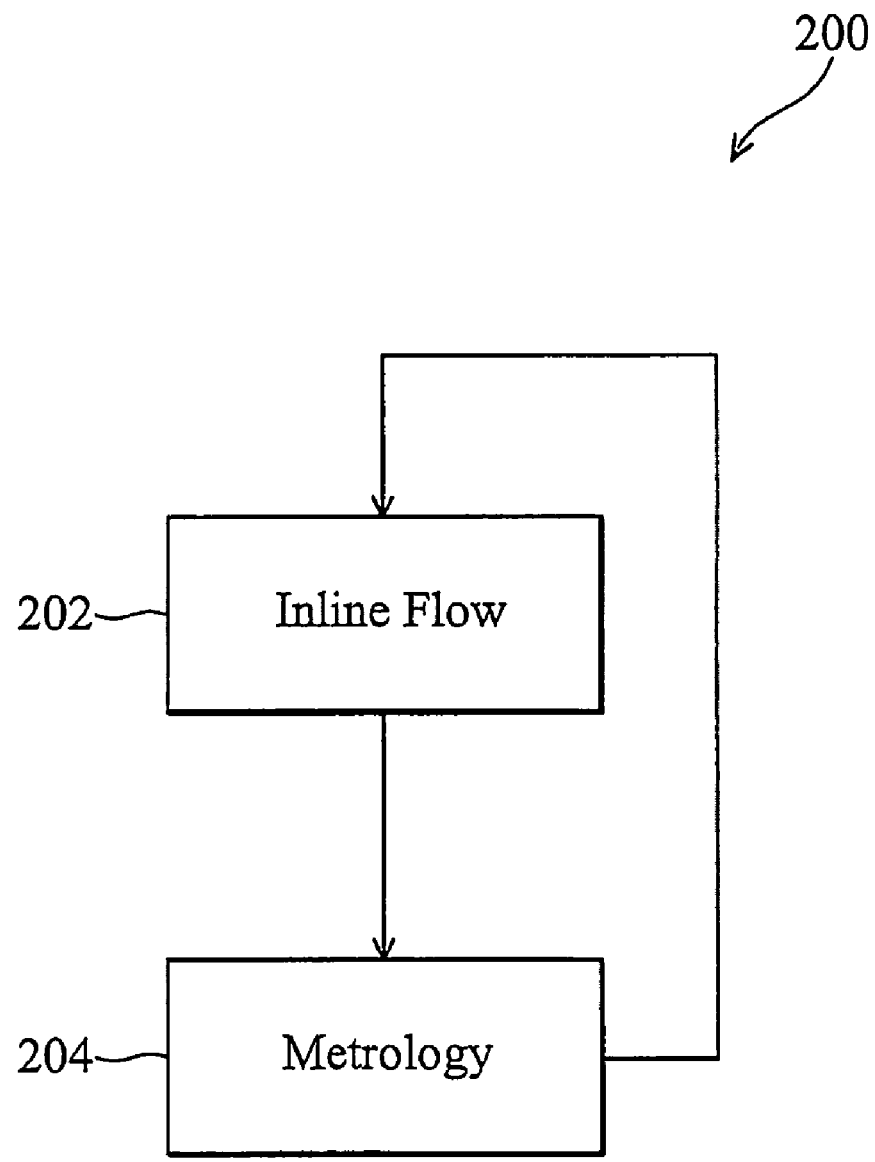
FIG. 2 illustrates a process performed by a critical dimension ("CD") controller according to one embodiment of the present disclosure.

Referring now to FIG. 2, shown therein is a process 200 performed by the CD controller 116 according to one embodiment of the present disclosure. In this embodiment, the process 200 may include two methods: an inline flow method 202 and a metrology method 204.

In one embodiment, the inline flow method 202 is performed by the inline process system 110 and/or the CD controller 116 (FIG. 1). A request is made for the process system 110 to provide an appropriate processing operation, e.g., a predetermined amount of exposure energy. In response, the CD controller 116 may calculate the energy amount according to the method and algorithm in the current disclosure. In one example, the appropriate amount of energy may be calculated as follows:

$$\text{Amount of Energy} = (\text{DefaultEnergy} + \text{ReticleEnergy}) * \text{ToolRatio} + \text{Correction}$$

DefaultEnergy is a predetermined amount of exposure energy (expose dose, energy, or dose) for the system 110, such as a best known method supplied by a tool supplier.

ReticleEnergy is a predetermined amount of expose energy for the product being processed and the reticle being used. It may also be determined by a combination of a product identification and a reticle identification. In one example, the ReticleEnergy may be obtained from Table 1 as follows:

TABLE 1

| RETICLE ID | PRODUCT ID | RETICLE ENERGY |
|---|---|---|
| F123A | ABC 849 | −0.65 |
| F124A | ABC 849 | −1.02 |
| F125A | ABC 849 | −0.4 |
| F125A | ABC 850 | −0.83 |

The Reticle ID refers to specific reticle (photomask, or mask). Product ID refers to a certain product being manufactured.

ToolRatio is an amount determined by performances of different inline process tools. In one example, ToolRatio may be obtained from Table 2 as follows:

TABLE 2

| EQUIPMENT ID | LINESPACE ID | TECHNOLOGY | TOOL RATIO | CONTROLLER ID |
|---|---|---|---|---|
| NPD7C1 | VIA | T094AHE | | 100 VIAX11-DTV |
| NPD7C5 | VIA | S049ACA | | 106 CDMON |
| NPD7C5 | M3 | S049 | | 115 IMP913 |
| NPD7C5 | M2 | S049AAA | | 104 IMPX13 |
| NPD7C5 | M1 | E738-S049AHA | | 91.603 MET113-E738 |
| NPD7C5 | M1 | S049 | 91.603 | MET113 |

Equipment ID identifies a particular photolithography equipment. Linespace ID identifies a specific patterning feature. Technology identifies a certain semiconductor process (e.g., 0.13 micron LOGIC). Tool Ratio is a value associated with the identified piece of equipment (from Equipment ID).

Correction represents a compensatory energy value. In one example, Correction may be obtained from Table 3 as follows:

TABLE 3

| EQUIPMENT ID | PRODUCT ID | MASK LEVEL | CORRECTION |
|---|---|---|---|
| NPABA3 | TMH552 | 130A | 0.0321 |
| NPABC4 | CEHM3S | 130C | −0.0116 |
| NPABC4 | TME913A-EAZN | 130A | −0.0334 |
| NPABC4 | TME913A-T3EAZN | 130A | −0.018 |
| NPABC4 | TME913A-T4EAZN | 130A | −0.0098 |

Mask Level represents a structural layer in a semiconductor wafer patterned by a corresponding mask.

As will be described in connections with FIG. 3 and the metrology method 204, some of the parameters, such as ReticleEnergy, ToolRatio, and Correction, may be adjusted after feedback is provided to the CD controller 116.

Figure 3:
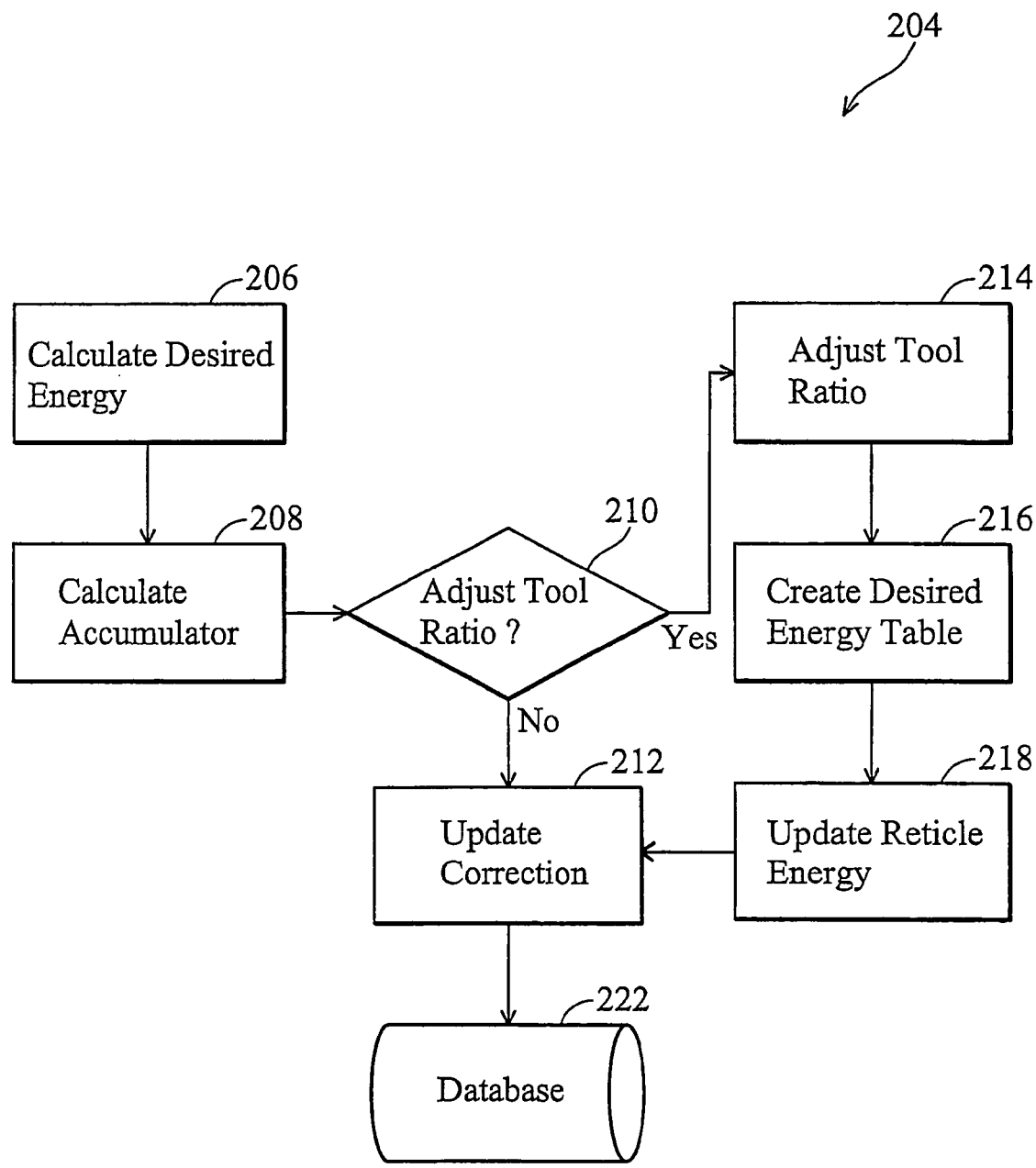
FIG. 3 illustrates a method provided by the CD controller according to one embodiment of the present disclosure.

Referring now to FIG. 3, according to one embodiment of the present disclosure, the metrology method 204 provided by the CD controller 116 begins at step 206, where the CD controller calculates desired energy. In one embodiment, the step 206, the CD controller 116 calculates the desire energy according to two formulas. First, Adjusted Energy may be calculated as follows:

Adjusted Energy=(CD target−CD mean)*CD slope

"CD target" may represent the targeted CD of the wafer. In one example, a 0.13 micron semiconductor product may comprise a CD of 0.13 micron.

"CD mean" may represent the average (mean) of the measured CD data. After a wafer has been processed by the inline process system 110 of FIG. 1, a machine operator may transfer the wafer to the CD-SEM metrology system 112 of FIG. 2 to measure the CD on the wafer. The measurement, which may be conducted by any known method, may utilize a microscope to obtain several sample points from the wafer.

"CD slope" may be obtained by dividing the Amount of Energy (pursuant to the method 202) by the CD target.

In furtherance of the example, Desired Energy may then be calculated by a feedback system. In one example, Desired Energy for the next run (represented by n+1, while n refers to the current run) may be calculated according to the following formula:

Desired Energy (n+1)=weight*Desired Energy (n)+ (1−weight)*(Final Energy+Adjusted Energy)

In the above formula, Final Energy may be equal to the Amount of Energy obtained by the method 202 or other defined energy amount. The weight may be a value provided by a system user from such things as previous experience or other available data.

At step 208, an accumulator is used to calculate the Amount of Energy. In one embodiment, the CD controller 116 calculates the accumulated error between CD target and CD mean, according to the following formulas.

The following calculations may be utilized:

$$R(t) = R(t-1) + 1, \quad \text{(a)}$$
$$\text{if } mask_{tth}(t) \notin \{mask_{1th}, mask_{2nd}, \ldots, mask_{R(t-1)th}\}$$

$$F_j(t) = F_j(t-1) + 1, \text{ if } f_{jk}(t) \notin \{f_{j1}, f_j, f_{j3}, \ldots, f_{jk}(t-1)\} \quad \text{(b)}$$

$$N(t) = \sum_{j=1}^{R(t)} F_j(t) \quad \text{(c)}$$

$$Q^{(i)}(t) = \sum_{j=1}^{R(t)} \sum_{k=1}^{F_j(t)} \tilde{Q}_{jk}^{(i)}(t) \quad \text{(d)}$$

$$\tilde{Q}_{jk}^{(i)}(t) = \ln d_{jk}(t) - \ln f_{jk} \quad \text{(e)}$$

$$d_{jk}(t) = \frac{\bar{d}_{jk}(t)}{K_{jk}(t)} \quad \text{(f)}$$

$$\bar{d}_{jk}(t) = \bar{d}_{jk}(t-1) - d_{jk}^{last}(t) + d_{jk}^{new}(t) \quad \text{(g)}$$

$$Q^{(i)}(0) = F_j(0) = K_{jk}(0) = N(0) = R(0) = d_{jk}(0) = \bar{d}_{jk}(0) = 0 \quad \text{(h)}$$

Where:

$Q^{(i)}(t)$: accumulated tool distinction since last update for a same tool and a same control ID;

$R(t)$: accumulated reticle number after last update for a same tool and a same control ID;

$F_j(t)$: accumulated number of exposure energy since last update for the $j^{th}$ mask with a same tool and a same control ID;

$K_{ij}(t)$: accumulated number of same run since last update for the $j^{th}$ mask under a same tool and a same control ID. Same run represents for runs of a same exposure energy. A repeating measurement does not account for same run;

$N(t)$: accumulated number of runs since last update for a same tool and a same control ID. Same run only account for once;

$f_{jk}$: exposure energy for $k^{th}$ run and $j^{th}$ mask with a same tool and a same control ID;

$d_{jk}^{last}$: previous desire energy of a lot for $k^{th}$ run and $j^{th}$ mask with a same tool and a same control ID (only for a situation when a same lot is measured more than once); and $d_{jk}^{new}$: latest desire energy of a lot for $k^{th}$ run and $j^{th}$ mask with a same tool and a same control ID.

Accordingly, $K_{ij}(t)$ may be obtained as follows:

Whenever any new CD data ($d_{jk}^{new}(t)$) is obtained, check $CDMEAN_j^{old}(t)$:

If $CDMEAN_j^{old}(t)$ exists already, then $\begin{cases} K_{jk}(t) = K_{jk}(t-1), \text{ if } K_{jk}(t-1) \neq 0 \\ K_{jk}(t) = 1, \text{ if } K_{jk}(t-1) = 0 \\ d_{jk}^{last}(t) = CDMEAN_j^{old}(t) + w_{jk} \times \Delta CD_{last} \times slope_i \\ d_{jk}^{new}(t) = CDMEAN_j^{new}(t) + w_{jk} \times \Delta CD_{new} \times slope_i \end{cases}$ otherwise, ($CDMEAN_j(t)$ does not exist)

$\begin{cases} K_{jk}(t) = K_{jk}(t-1) + 1, \\ d_{jk}^{last}(t) = 0 \\ d_{jk}^{new}(t) = CDMEAN_j^{new}(t) + w_{jk} \times \Delta CD_{new} \times slope_i \end{cases}$ End If In one example, the above calculations may be realized by applying a dynamic 3-dimensional array: the X axis may represent the control ID, while the Y-Z axes may represent exposure energy and contribution, respectively.

Following the update of ToolRatio, used variables $Q^{(i)}$, $\tilde{Q}^{(i)}$, $F_j$, $K_{jk}$, N, R, $d_{jk}$, $d_{jk}$ may be reset under the following conditions: run to run automatic update (V2.0), initialization, manual F/B update (V1.0), or manual update following lens cleaning.

Referring again to FIG. 3, at step 210, a determination is made as to whether the ToolRatio may be adjusted. In one example, the following table may be used to determine whether ToolRatio may be adjusted.

| Product Count Range | Exponential Accumulator abs($q_t^{(i)}$ − 1) | Action |
|---|---|---|
| $N_t^{(i)} \geq 3$ and $N_t^{(i)} < 5$ | >0.03 | PE Determines 1. Adjust 2. Reset |
| $N_t^{(i)} \geq 5$ and $N_t^{(i)} < 10$ | >0.02 | Adjust by system |
| $N_t^{(i)} \geq 10$ | >0.01 | Adjust by system |
| $N_t^{(i)} \geq 15$ | | Adjust by system |

If the ToolRatio remains unadjusted, step 212 may update the Correction value. The step 212 of the method 204, which updates Correction, may utilize the following formula:

New Correction Energy=Desired Energy (*n*+1)−(DefaultEnergy+1)−(DefaultEnergy+ReticleEnergy) *ToolRatio

| Reticle Number | Exposure Energy Number | $f_{jk}(t)$ | $d_{jk}^{last}(t)$ | $d_{jk}^{new}(t)$ | $K_{jk}(t)$ | $\bar{d}_{jk}(t)$ | $d_{jk}(t)$ | $\tilde{Q}_{jk}^{(i)}(t)$ |
|---|---|---|---|---|---|---|---|---|
| j = 1 | k = 1 | $f_{j1}$ | $d_{11}^{last}(t)$ | $d_{11}^{new}(t)$ | $K_{11}(t)$ | $\bar{d}_{11}(t)$ | $d_{11}(t)$ | $\tilde{Q}_{11}^{(i)}(t)$ |
| j = 1 | k = 2 | $f_{j2}$ | $d_{12}^{last}(t)$ | $d_{12}^{new}(t)$ | $K_{12}(t)$ | $\bar{d}_{12}(t)$ | $d_{12}(t)$ | $\tilde{Q}_{12}^{(i)}(t)$ |
| j = 1 | ⋮ | ⋮ | ⋮ | ⋮ | ⋮ | ⋮ | ⋮ | ⋮ |
| j = 1 | k = $F_1(t)$ | $f_{1F_1(t)}$ | $d_{1F_1(t)}^{last}(t)$ | $d_{1F_1(t)}^{new}(t)$ | $K_{1F_1(t)}(t)$ | $\bar{d}_{1F_1(t)}(t)$ | $d_{1F_1(t)}(t)$ | $\tilde{Q}_{1F_1}^{(i)}(t)$ |
| j = 2 | k = 1 | $f_{21}$ | $d_{21}^{last}(t)$ | $d_{21}^{new}(t)$ | $K_{21}(t)$ | $\bar{d}_{21}(t)$ | $d_{21}(t)$ | $\tilde{Q}_{21}^{(i)}(t)$ |
| j = 2 | k = 2 | $f_{22}$ | $d_{22}^{last}(t)$ | $d_{22}^{new}(t)$ | $K_{22}(t)$ | $\bar{d}_{22}(t)$ | $d_{22}(t)$ | $\tilde{Q}_{22}^{(i)}(t)$ |
| j = 2 | ⋮ | ⋮ | ⋮ | ⋮ | ⋮ | ⋮ | ⋮ | ⋮ |
| j = 2 | k = $F_2(t)$ | $f_{2F_2(t)}$ | $d_{2F_2(t)}^{last}(t)$ | $d_{2F_2(t)}^{new}(t)$ | $K_{2F_2(t)}(t)$ | $\bar{d}_{2F_2(t)}(t)$ | $d_{2F_2(t)}(t)$ | $\tilde{Q}_{2F_2}^{(i)}(t)$ |
| ⋮ | ⋮ | ⋮ | ⋮ | ⋮ | ⋮ | ⋮ | ⋮ | ⋮ |
| J = R(t) | k = 1 | $f_{R1}$ | $d_{R1}^{last}(t)$ | $d_{R1}^{new}(t)$ | $K_{R1}(t)$ | $\bar{d}_{R1}(t)$ | $d_{R1}(t)$ | $\tilde{Q}_{R1}^{(i)}(t)$ |
| J = R(t) | k = 2 | $f_{R2}$ | $d_{R2}^{last}(t)$ | $d_{R2}^{new}(t)$ | $K_{R2}(t)$ | $\bar{d}_{R2}(t)$ | $d_{R2}(t)$ | $\tilde{Q}_{R2}^{(i)}(t)$ |
| J = R(t) | ⋮ | ⋮ | ⋮ | ⋮ | ⋮ | ⋮ | ⋮ | ⋮ |
| J = R(t) | k = $F_R(t)$ | $f_{RF_R(t)}$ | $d_{RF_R(t)}^{last}(t)$ | $d_{RF_R(t)}^{new}(t)$ | $K_{RF_R(t)}(t)$ | $\bar{d}_{RF_R(t)}(t)$ | $d_{RF_R(t)}(t)$ | $\tilde{Q}_{(RF)_R}^{(i)}(t)$ |

The total Q: $Q^{(i)}(t) = \sum_{j=1}^{R(t)} \sum_{k=1}^{k=Fj(t)} \tilde{Q}_{jk}^{(i)}(t)$ Final Tool Drift: $q_t^{(i)} = EXP\left(\frac{Q^{(i)}(t)}{R(t)}\right)$ New Tool Ratio: $TR^{(i)}(new) = q_t^{(i)} \times TR^{(i)}(old)$ The parameters from the above equation, which may be stored in a database 222, have already been described in connections with the method 202 and the step 206.

If the ToolRatio is adjusted, step 214 of the method 204 adjusts the ToolRatio value and at step 216, a desired energy table is created. At step 218 the ReticleEnergy is updated accordingly.

An example of utilizing the methods 202 and 204 will now be described. In this example, it can be assumed:
ToolRatio of the tool APHO1 is 98.7%,
ReticleEnergy of the product and layer TM1234-130A is 1.37,
Correction of APHO1 and TM1234-130A is 0.32,
For the sake of simplification, the accumulator is assumed to be 1.06,
DefaultEnergy, which may be 55, is entered by the user.
Now, pursuant to the method 202, Amount of Energy=(55+1.37)*0.987+0.32=55.9572 mj (mini joule)

Then, pursuant to the method 204 and assume that Desired Energy (n) is 55 and DefaultEnergy is 55, $$\text{Adjusted Energy} = (CD \text{ Target} - CD \text{ Mean}) * CD \text{ Slope}$$
$$= (0.13 - 0.128) * 100$$
$$= 0.2$$

$$\text{Desired Energy } (n+1) = \text{Desired Energy}(n) * (1 - \text{weight}) +$$
$$(\text{Final Energy} + \text{Adjusted Energy})$$
$$= 55 * 0.9 + (55.9572 + 0.2) * 0.1$$
$$= 49.5 + 5.61572$$
$$= 55.17572$$

Then, pursuant to the step 210 of the method 204, assessment will be made with respect to whether ToolRatio may be adjusted. If no adjustment is necessary, then following the step 212 of the method 204, New Correction is as follows:

New Correction Energy=Desired Energy (n+1)−(DefaultEnergy+ReticleEnergy)*ToolRatio=55.17572−(55+1.37)*0.987=−0.46174

On the other hand, if ToolRatio is adjusted, the step 214 of the method 204 may be followed:

New ToolRatio of APHO1=0.987*1.06=1.04622

Although only a few exemplary embodiments of this invention have been described in detail above, those skilled in the art will readily appreciate that many modifications are possible in the exemplary embodiments without materially departing from the novel teachings and advantages of this invention. Also, features illustrated and discussed above with respect to some embodiments can be combined with features illustrated and discussed above with respect to other embodiments. Accordingly, all such modifications are intended to be included within the scope of this invention.

What is claimed is:

1. A method for obtaining a desired energy value required to control critical dimensions of a semiconductor product during a semiconductor processing operation in a production flow, the method comprising:
   measuring a previously formed critical dimension on the product;
   calculating a first energy value based on the measured critical dimension and a desired critical dimension for the semiconductor processing operation; and
   obtaining the desired energy value based on the first energy value and a previously-obtained desired energy for the semiconductor processing operation performed on a prior product in the production flow.

2. The method of claim 1 wherein calculating the first energy value comprises obtaining the result of the following:

(a targeted critical dimension−a mean of measured critical dimension data)*a critical dimension slope value supplied by a critical dimension controller.

3. The method of claim 1 wherein the product is a semiconductor wafer, and the prior product is a semiconductor wafer that was immediately processed by a same system as being used to perform the semiconductor processing operation.

4. The method of claim 1 wherein the obtained desired energy value is also based on a user defined value, wherein the user defined value indicates previous experience or other data of the product.

5. The method of claim 4 wherein the obtained desired energy value is also based on a second energy value supplied by a critical dimension controller.

6. The method of claim 5 wherein the obtaining comprises calculating the following:

the desired energy value=weight*the desire energy value for immediately prior product+(1−weight)*(the second energy value+the first energy value).

7. A method for obtaining a new correction energy value required to control critical dimensions of a semiconductor product during a semiconductor processing operation in a production flow, the method comprising:
   supplying a tool ratio value based on a lithography system;
   obtaining an energy figure based on a first predetermined energy value for a lithography system and a second predetermined energy value for a product; and
   providing a new correction energy based on a plurality of elements including the tool ratio value, the energy figure, and a desired energy value wherein the desired energy value is based on a calculated first energy value and a previously-obtained desired energy for a semiconductor processing operation performed on a prior product in a production flow.

8. The method of claim 7 wherein the energy figure equals to the sum of the first predetermined energy value and the second predetermined energy value.

9. The method of claim 7 wherein the tool ratio is determined by performance of lithography process tools.

10. The method of claim 7 wherein the product is a semiconductor wafer, and the prior product is a semiconductor wafer that was previously processed by a same system as being used to perform the semiconductor processing operation.

11. The method of claim 7 wherein the providing comprises obtaining data from multiplying the energy figure by the tool ratio wherein the tool ratio is determined by performance of lithography process tools.

12. The method of claim 7 wherein the providing comprises calculating the following:

the new correction energy=the desired energy value−(the first predetermined energy value+the second predetermined energy value)*the tool ratio, wherein the tool ratio is determined by performance of lithography process tools.

13. The method of claim 7 wherein the new correction energy is applied to low-volume and high-quality semiconductor products.

14. A method for obtaining a new correction energy value required to control critical dimensions of a semiconductor product during a semiconductor processing operation in a production flow, the method comprising:
   measuring a previously formed critical dimension on a product;
   obtaining a desired energy value for the product wherein the desired energy value is based on a calculated first energy value and a previously-obtained desired energy for a semiconductor processing operation performed on a prior product in a production flow;
   supplying an accumulated error between a targeted critical dimension ("CD Target") and mean of measured critical dimension data ("CD Mean"); and
   calculating a new correction energy based on a plurality of elements including the desired energy figure, and a tool ratio value based on a lithography system.

15. The method of claim 14 wherein the product is a semiconductor wafer, and the prior product is a semiconductor wafer that was previously processed by a same system as being used to perform the semiconductor processing operation.

16. The method of claim 14 wherein the obtaining includes calculating the following:

$$\text{the desired energy value} = \text{weight} * \text{a desired energy value for an immediately prior product} + (1 - \text{weight}) * (\text{a second energy value supplied by a critical dimension controller} + \text{the first energy value}),$$

wherein the first energy value is based on CD Target and CD Mean for the semiconductor processing operation.

17. The method of claim 16 wherein the first energy value equals to the result of (CD Target−CD Mean)*the second energy value supplied by the critical dimension controller/CD Target.

18. The method of claim 14 wherein the supplying includes utilizing a dynamic 3-dimensional array.

19. The method of claim 14 wherein the supplying includes obtaining a new tool ratio.

20. The method of claim 14 wherein the calculating includes obtaining the following:

$$\text{the new correction energy} = \text{the desired energy} - (\text{a first predetermined energy value for a lithography system} + \text{a second predetermined energy value for a product}) * \text{the tool ratio}.$$

* * * * *